United States Patent
Wang et al.

(10) Patent No.: US 11,774,485 B2
(45) Date of Patent: Oct. 3, 2023

(54) FAULT DIAGNOSIS METHOD AND APPARATUS FOR SUBMARINE CABLE, AND DEVICE

(71) Applicants: Cangzhou Power Supply Company, State Grid Hebei Electric Power Co., Ltd., Hebei (CN); State Grid Hebei Electric Power Co., Ltd., Hebei (CN)

(72) Inventors: Lei Wang, Hebei (CN); Peng Yang, Hebei (CN); Xuebin Wang, Hebei (CN); Chunlei Zhao, Hebei (CN); Chunxiao Li, Hebei (CN); Wenle Song, Hebei (CN)

(73) Assignees: Cangzhou Power Supply Company, State Grid Hebei Electric Power Co., Ltd., Cangzhou (CN); State Grid Hebei Electric Power Co., Ltd., Shijiazhuang (CN)

(*) Notice: Subject to any disclaimer, the term of this patent is extended or adjusted under 35 U.S.C. 154(b) by 133 days.

(21) Appl. No.: 17/599,552

(22) PCT Filed: Aug. 18, 2021

(86) PCT No.: PCT/CN2021/113163
§ 371 (c)(1),
(2) Date: Sep. 29, 2021

(87) PCT Pub. No.: WO2022/198899
PCT Pub. Date: Sep. 29, 2022

(65) Prior Publication Data
US 2023/0160939 A1   May 25, 2023

(30) Foreign Application Priority Data
Mar. 24, 2021   (CN) .......................... 202110313246.4

(51) Int. Cl.
*G01R 31/08* (2020.01)

(52) U.S. Cl.
CPC ......... *G01R 31/083* (2013.01); *G01R 31/088* (2013.01)

(58) Field of Classification Search
CPC .......................... G01R 31/083; G01R 31/088
USPC ........................................................ 324/512
See application file for complete search history.

(56) References Cited

U.S. PATENT DOCUMENTS

2020/0083679 A1* 3/2020 Zukerman ................ H02G 1/06

FOREIGN PATENT DOCUMENTS

CN          111504635 A       8/2020

OTHER PUBLICATIONS

An-Qiang Lü et al., a Fault Diagnosis Method Forwavelet Packet and Neural Network-Based Submarine Cables, Study on Optical Communications, Apr. 30, 2016, pp. 26-29, No. 2, ISSN:1005-8788.

* cited by examiner

*Primary Examiner* — Farhana A Hoque

(57) ABSTRACT

The present disclosure is applicable to the technical field of maintenance of submarine cables, and provides a fault diagnosis method and apparatus for a submarine cable, and a device. The method includes: obtaining deployment data and sensed data of a target submarine cable; and inputting the deployment data and the sensed data into a trained fault diagnosis model to obtain a diagnosis result of the target submarine cable, where the fault diagnosis model is a probabilistic neural network model, and the diagnosis result includes a fault type. The present disclosure uses the trained probabilistic neural network model as the fault diagnosis model to diagnose a fault of the target submarine cable, and can quickly and accurately obtain the fault type of the target submarine cable.

8 Claims, 2 Drawing Sheets

FAULT DIAGNOSIS METHOD AND APPARATUS FOR SUBMARINE CABLE, AND DEVICE

TECHNICAL FIELD

The present disclosure relates to the technical field of maintenance of submarine cables, and in particular, to a fault diagnosis method and apparatus for a submarine cable, and a device.

BACKGROUND

At present, with the rapid development of China's social economy and the continuous deepening of ocean exploitation and utilization such as offshore oil fields, the sea-crossing transmission network continues to extend and cover coastal areas and nearby islands at a higher voltage grade, and submarine cables are applied more widely. Due to a harsh marine environment, long-term erosion by seawater, and anchor damages caused by offshore ships, the submarine cables are often faulty, seriously affecting safe and stable operation of a see-crossing power grid.

However, there is no technology now to monitor the submarine cables in real time and determine a fault type in time.

SUMMARY

In view of this, the present disclosure provides a fault diagnosis method and apparatus for a submarine cable, and a device, to monitor a status of a submarine cable and determine a fault type in time.

According to a first aspect, an embodiment of the present disclosure provides a fault diagnosis method for a submarine cable, including:
  obtaining deployment data and sensed data of a target submarine cable; and
  inputting the deployment data and the sensed data into a trained fault diagnosis model to obtain a diagnosis result of the target submarine cable, where the fault diagnosis model is a probabilistic neural network model, and the diagnosis result includes a fault type.

Optionally, before the inputting the deployment data and the sensed data into a trained fault diagnosis model, the method further includes:
  establishing an initial fault diagnosis model; and
  training the initial fault diagnosis model based on a differential evolution algorithm and a training sample to obtain the trained fault diagnosis model.

Optionally, the training the initial fault diagnosis model based on a differential evolution algorithm and a training sample to obtain the trained fault diagnosis model includes:
  optimizing a smoothing parameter in the initial fault diagnosis model based on the differential evolution algorithm to obtain a target smoothing parameter, where the smoothing parameter is a to-be-optimized item of the differential evolution algorithm, an objective function is a mean square deviation between a fault type obtained through fault diagnosis performed by the fault diagnosis model on the training sample and a real fault type of the training sample, and an optimal solution of the differential evolution algorithm minimizes the objective function; and
  training, based on the training sample, a fault diagnosis model that uses the target smoothing parameter, to obtain the trained fault diagnosis model.

Optionally, the optimizing a smoothing parameter in the initial fault diagnosis model based on a differential evolution algorithm to obtain a target smoothing parameter includes:
  generating, in space of a preset dimension, individuals of a preset quantity that meet a preset constraint to obtain an initial population, where each individual is a candidate smoothing parameter;
  using the initial population as a parent population, randomly selecting individuals of a specified quantity in the parent population as mutation objects, and performing an evolutionary operation on the parent population based on the mutation objects and the objective function to obtain a child population; and
  if a total quantity of evolutionary operations is not less than a preset value, determining an optimal individual in the child population as the target smoothing parameter; otherwise, using the child population as a new parent population, and performing the step of "randomly selecting individuals of a specified quantity in the parent population as mutation objects, and performing an evolutionary operation on the parent population based on the mutation objects and objective function".

Optionally, before the training the initial fault diagnosis model based on a differential evolution algorithm and a training sample to obtain the trained fault diagnosis model, the method further includes:
  obtaining the training sample from a twin database, where the twin database includes deployment data, sensed data, and a fault type of a historical faulty submarine cable, and the training sample is generated based on the deployment data, the sensed data, and the fault type of the historical faulty submarine cable.

Optionally, the method further includes:
  obtaining deployment data of a specified submarine cable from an engineering database and sensed data of the specified submarine cable from a sensing device;
  establishing a digital twin of the specified submarine cable based on the deployment data and the sensed data of the specified submarine cable, where the digital twin includes the twin database; and
  updating the digital twin based on sensed data collected by the sensing device in real time.

Optionally, the obtaining deployment data and sensed data of a target submarine cable includes:
  obtaining the deployment data and the sensed data of the target submarine cable from the twin database; or
  obtaining the deployment data of the target submarine cable from the engineering database and the sensed data of the target submarine cable from the sensing device; where
  the sensing device includes at least one of the following: a ship monitoring device, an optical fiber perturbation monitoring device, a temperature detection device, and a strain monitoring device; and
  the deployment data includes environmental information and/or cable routing information of the target submarine cable, and the sensed data includes at least one of the following:
  ship information, perturbation information, temperature information and strain information of an area in which the target submarine cable is located; and
  after the inputting the deployment data and the sensed data into a trained fault diagnosis model to obtain a diagnosis result of the target submarine cable, the method further includes:

storing the diagnosis result in the twin database; and/or when the diagnosis result of the target submarine cable indicates that a fault occurs, sending an alarm message to a target terminal device to enable the target terminal device to display the alarm message, where the alarm message includes at least one of the following: an identifier (ID), the fault type, and a position message of the target submarine cable.

According to a second aspect, an embodiment of the present disclosure provides a fault diagnosis apparatus for a submarine cable, including:

an obtaining module, configured to obtain deployment data and sensed data of a target submarine cable; and a diagnosis module, configured to input the deployment data and the sensed data into a trained fault diagnosis model to obtain a diagnosis result of the target submarine cable, where the fault diagnosis model is a probabilistic neural network model, and the diagnosis result includes a fault type.

Optionally, the apparatus further includes:

a model establishment module, configured to establish an initial fault diagnosis model before the deployment data and the sensed data are input into the trained fault diagnosis model; and a model training module, configured to train the initial fault diagnosis model based on a differential evolution algorithm and a training sample to obtain the trained fault diagnosis model.

Optionally, the model training module includes:

a smoothing parameter determining unit, configured to optimize a smoothing parameter in the initial fault diagnosis model based on the differential evolution algorithm to obtain a target smoothing parameter, where the smoothing parameter is a to-be-optimized item of the differential evolution algorithm, an objective function is a mean square deviation between a fault type obtained through fault diagnosis performed by the fault diagnosis model on the training sample and a real fault type of the training sample, and an optimal solution of the differential evolution algorithm minimizes the objective function; and a sample training unit, configured to train, based on the training sample, a fault diagnosis model that uses the target smoothing parameter, to obtain the trained fault diagnosis model.

Optionally, the smoothing parameter determining unit is further configured to:

generate, in space of a preset dimension, individuals of a preset quantity that meet a preset constraint to obtain an initial population, where each individual is a candidate smoothing parameter;

use the initial population as a parent population, randomly select individuals of a specified quantity in the parent population as mutation objects, and perform an evolutionary operation on the parent population based on the mutation objects and the objective function to obtain a child population; and if a total quantity of evolutionary operations is not less than a preset value, determine an optimal individual in the child population as the target smoothing parameter; otherwise, use the child population as a new parent population, and perform the step of "randomly selecting individuals of a specified quantity in the parent population as mutation objects, and performing an evolutionary operation on the parent population based on the mutation objects and objective function to a child population".

Optionally, the model training module further includes:

a sample obtaining unit, configured to obtain the training sample from a twin database before the initial fault diagnosis model is trained based on the differential evolution algorithm and the training sample to obtain the trained fault diagnosis model, where the twin database includes deployment data, sensed data, and a fault type of a historical faulty submarine cable, and the training sample is generated based on the deployment data, the sensed data, and the fault type of the historical faulty submarine cable.

Optionally, the obtaining module is further configured to:

obtain deployment data of a specified submarine cable from an engineering database and sensed data of the specified submarine cable from a sensing device;

establish a digital twin of the specified submarine cable based on the deployment data and the sensed data of the specified submarine cable, where the digital twin includes the twin database; and update the digital twin based on sensed data collected by the sensing device in real time.

Optionally, the obtaining module is further configured to:

obtain the deployment data and the sensed data of the target submarine cable from the twin database; or obtain the deployment data of the target submarine cable from the engineering database and the sensed data of the target submarine cable from the sensing device; where the sensing device includes at least one of the following: a ship monitoring device, an optical fiber perturbation monitoring device, a temperature detection device, and a strain monitoring device; and the deployment data includes environmental information and/or cable routing information of the target submarine cable, and the sensed data includes at least one of the following:

ship information, perturbation information, temperature information and strain information of an area in which the target submarine cable is located; and after the deployment data and the sensed data are input into the trained fault diagnosis model to obtain the diagnosis result of the target submarine cable, store the diagnosis result in the twin database; and/or when the diagnosis result of the target submarine cable indicates that a fault occurs, send an alarm message to a target terminal device to enable the target terminal device to display the alarm message, where the alarm message includes at least one of the following: an ID, the fault type, and a position message of the target submarine cable.

According to a third aspect, an embodiment of the present disclosure provides an electronic device, including a memory, a processor, and a computer program stored in the memory and able to run on the processor, where the processor performs steps of any fault diagnosis method for a submarine cable when running the computer program.

According to a fourth aspect, an embodiment of the present disclosure provides a computer-readable storage medium, where the computer-readable storage medium stores a computer program, and the computer program, when executed by a processor, performs steps of any fault diagnosis method for a submarine cable.

Compared with the prior art, the present disclosure has the following beneficial effects:

The present disclosure provides a fault diagnosis method for a submarine cable, including: obtaining deployment data and sensed data of a target submarine cable; and inputting the deployment data and the sensed data into a trained fault diagnosis model to obtain a diagnosis result of the target submarine cable, where the fault diagnosis model is a probabilistic neural network model, and the diagnosis result includes a fault type. The present disclosure uses the trained probabilistic neural network model as the fault diagnosis model to diagnose a fault of the target submarine cable, and can quickly and accurately obtain the fault type of the target submarine cable.

BRIEF DESCRIPTION OF THE DRAWINGS

To describe the technical solutions in the embodiments of the present disclosure more clearly, the following briefly describes the accompanying drawings required for describing the embodiments or the prior art. Apparently, the accompanying drawings in the following description merely show some embodiments of the present disclosure, and persons of ordinary skill in the art may still derive other accompanying drawings from these accompanying drawings without creative efforts.

DETAILED DESCRIPTION

In the following description, specific details such as a specific system structure and a technology are provided for description instead of limitation, to thoroughly understand embodiments of the present disclosure. However, those skilled in the art should understand that the present disclosure may also be implemented in other embodiments without these specific details. In other cases, detailed descriptions of a well-known system, apparatus, circuit, and method are omitted to avoid unnecessary details interfering with the description of the present disclosure.

In order to make the objectives, technical solutions and advantages of the present disclosure clearer, the following provides description with reference to accompanying drawings and specific embodiments.

Figure 1:
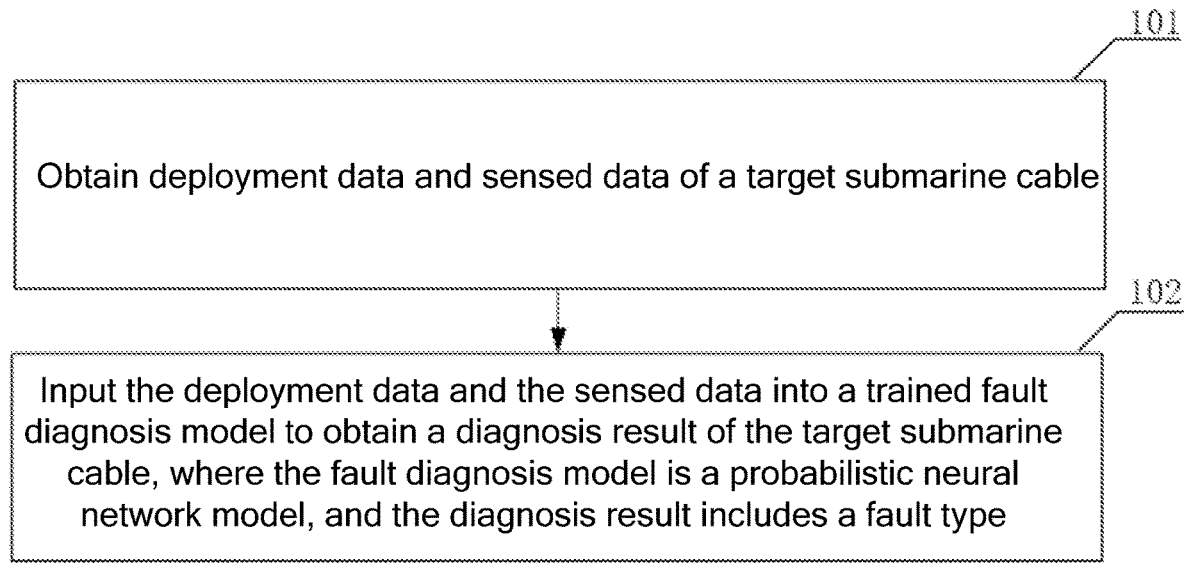
FIG. 1 is a flowchart of implementing a fault diagnosis method for a submarine cable according to an embodiment of the present disclosure.

FIG. 1 is a flowchart of implementing a fault diagnosis method for a submarine cable according to an embodiment of the present disclosure. The method is described in detail below:

Step 101: Obtain deployment data and sensed data of a target submarine cable.

In this embodiment, the target submarine cable can be determined based on a specified cable position and cable quantity.

Step 102: Input the deployment data and the sensed data into a trained fault diagnosis model to obtain a diagnosis result of the target submarine cable, where the fault diagnosis model is a probabilistic neural network model, and the diagnosis result includes a fault type.

In this embodiment, the probabilistic neural network model is used as the fault diagnosis model. A probabilistic neural network is a feedforward neural network, which has advantages of a simple structure and a fast network training process. The probabilistic neural network in the submarine-cable fault diagnosis model is composed of an input layer, a mode layer, a summation layer, and an output layer, and can process data in real time.

Optionally, before the inputting the deployment data and the sensed data into a trained fault diagnosis model, the method further includes:

establishing an initial fault diagnosis model, where
in this embodiment, an estimation formula of a probability density function (PDF) applied in the probabilistic neural network in the submarine-cable fault diagnosis model is as follows:

$$f_A(X) = \frac{1}{(2\pi)^{P/2} \delta^P} \frac{1}{m} \sum \exp\left[-\frac{(X - X_{ai})^T (X - X_{ai})}{2\delta^2}\right] \quad (1)$$

where X represents a to-be-determined fault sample; $X_{ai}$ represents an $i^{th}$ training vector in a fault mode; P represents a quantity of dimensions of the fault sample; m represents a quantity of training samples in the fault mode; and $\delta$ represents a smoothing parameter, and its value plays a key role in result classification and is usually determined manually based on experience; and training the initial fault diagnosis model based on a differential evolution algorithm and a training sample to obtain the trained fault diagnosis model.

Optionally, the training the initial fault diagnosis model based on a differential evolution algorithm and a training sample to obtain the trained fault diagnosis model includes the following steps:

Step 1: Optimize the smoothing parameter in the initial fault diagnosis model based on the differential evolution algorithm to obtain a target smoothing parameter, where the smoothing parameter is a to-be-optimized item of the differential evolution algorithm, an objective function is a mean square deviation between a fault type obtained through fault diagnosis performed by the fault diagnosis model on the training sample and a real fault type of the training sample, and an optimal solution of the differential evolution algorithm minimizes the objective function.

In this embodiment, the smoothing parameter in the initial fault diagnosis model is optimized based on the differential evolution algorithm to improve a classification speed and accuracy of the fault diagnosis model.

Optionally, the optimizing the smoothing parameter in the initial fault diagnosis model to obtain a target smoothing parameter includes:

generating, in space of a preset dimension, individuals of a preset quantity that meet a preset constraint to obtain an initial population, where each individual is a candidate smoothing parameter;

using the initial population as a parent population, randomly selecting individuals of a specified quantity in the parent population as mutation objects, and performing an evolutionary operation on the parent population based on the mutation objects and the objective function to obtain a child population; and if a total quantity of evolutionary operations is not less than a preset value, determining an optimal individual in the child population as the target smoothing parameter; otherwise, using the child population as a new parent population, and performing the step of "randomly selecting individuals of a specified quantity in the parent population as mutation objects, and performing an evolutionary operation on the parent population based on the mutation objects and objective function to a child population".

In this embodiment, the smoothing parameter is optimized based on the differential evolution algorithm. As a stochastic heuristic search algorithm, the differential evolution algorithm can perform global optimization, and has advantages of high precision and fast convergence. Operation parameters used in this embodiment include a scaling factor F, a crossover factor CR, a population size M, and a maximum quantity G of evolutionary generations. The evolutionary operation consists of mutation, crossover, and selection processes, and specifically includes the following steps.

(1) Generate the Initial Population.

M individuals meeting a population constraint are randomly generated in n-dimensional space. The operation is implemented as follows:

$$x_{ij}(0)=\text{rand}_{ij}(0,1)(x_{ij}^U-x_{ij}^L)+x_{ij}^L \quad (2)$$

where $x_{ij}^U$ and $x_{ij}^L$ respectively represents boundary conditions of a $j^{th}$ individual, namely, maximum and minimum values of the $j^{th}$ individual in an $i^{th}$ class; $\text{rand}_{ij}(0, 1)$ represents a generated random decimal belonging to [0, 1]; and $x_{ij}(0)$ represents an initial dataset.

(2) Perform a Mutation Operation.

Three individuals $x_{P1}$, $x_{P2}$, and $x_{P3}$ are randomly selected from the population, $i \neq p_1 \neq p_2 \neq p_3$, and the mutation operation is as follows:

$$h_{ij}(t+1)=x_{b1j}(t)+F(x_{P2j}(t)-x_{P3j}(t)) \quad (3)$$

where $x^{P2j}(t)-x_{P3j}(t)$ represents a differential vector, $p_1$, $p_2$, and $p_3$ represent serial numbers of the individuals in the population, $x_{b1j}(t)$ represents an optimal individual in the population in a current generation, and $h_{ij}(t+1)$ represents that an individual is generated for a $(t+1)^{th}$ iteration based on an optimal individual obtained in a $t^{th}$ iteration.

(3) Perform a Crossover Operation.

The crossover operation is intended to improve diversity of the population, and is performed as follows:

$$v_{ij}(t+1) = \begin{cases} h_{ij}(t+1), \text{randl}_{ij} \le CR \\ x_{ij}(t), \text{randl}_{ij} > CR \end{cases} \quad (4)$$

where $\text{randl}_{ij}$ represents the random decimal belonging to [0, 1]; CR represents a crossover probability, and a value range of CR is [0, 1]; represents that an sample generated by performing the crossover operation on an individual generated in a $(t+1)^{th}$ iteration process to replace original $x_{ij}(t)$; and $x_{ij}(t)$ represents a $j^{th}$ element of an $i^{th}$ class in a $t^{th}$ iteration process.

(4) Perform a Selection Operation.

The selection operation is to determine whether a target vector $x_{i1}(t)$ can become a next-generation individual of the population, compare an objective function value corresponding to the target vector $x_{i1}(t)$ and an objective function value corresponding to a test vector $v_{i1}(t+1)$, and retain an individual with a smaller objective function value:

$$x_i(t+1) = \begin{cases} v_i(t+1), f(v_{i1}(t+1)) < f(x_{i1}(t)) \\ x_{ij}(t), f(v_{i1}(t+1)) \ge f(x_{i1}(t)) \end{cases} \quad (5)$$

where $f(v_{i1}(t+1))$ represents the objective function value corresponding to $v_{i1}(t+1)$, $f(x_{i1}(t))$ represents the objective function value corresponding to $x_{i1}(t)$, and $v_i(t+1)$ represents an individual generated by performing the selection operation on $v_{ij}(t+1)$ in step (3), in other words, replacing each element in $v_i$.

The operations in steps (2) to (4) are repeated, evolution is stopped when the maximum quantity G of evolutionary generations is reached, and an optimal individual selected from a final population is an optimal solution of the smoothing parameter. The differential evolution algorithm used in this embodiment can quickly find the optimal solution of the smoothing parameter and improve accuracy of the optimal solution, so as to improve a speed and accuracy of diagnosing a submarine cable fault.

Step 2: Train, based on the training sample, a fault diagnosis model that uses the target smoothing parameter, to obtain the trained fault diagnosis model.

Optionally, this embodiment further includes:

obtaining deployment data of a specified submarine cable from an engineering database and sensed data of the specified submarine cable from a sensing device, where in this embodiment, the specified submarine cable may be a submarine cable in a specified area, and may be the same as or different from the target submarine cable on which fault diagnosis is performed; the engineering database includes data of a submarine cable during construction, such as a terrain, a water depth, a landform, a geological condition, hydrological data of an environment in which the submarine cable is located, as well as routing and crossover data of the submarine cable;

establishing a digital twin of the specified submarine cable based on the deployment data and the sensed data of the specified submarine cable, where the digital twin includes a twin database; and updating the digital twin based on sensed data collected by the sensing device in real time.

In this embodiment, a physical entity is composed of an actual submarine cable and a sensor system. Sensors collect operation data of the submarine cable in real time and transmit the operation data to the twin database for storage. The digital twin is a digital mapping of the physical entity in virtual space, and monitors an operation status of the submarine cable entity in real time. Simulation data of the digital twin is uploaded to the database in real time. A connection between various parts can realize dynamic flowing and real-time update and iteration of data, and the simulated digital twin is optimized, so that the simulated digital twin is more approximate to the submarine cable entity. By analyzing a fault diagnosis result of the submarine cable, a maintenance and overhaul scheme of the submarine cable can be optimized, reducing a fault probability.

The establishing a digital twin of a specified submarine cable is to establish a highly simulated model of the specified submarine cable in the virtual space, specify a digital description of the physical entity of the submarine cable in the virtual space, and transmit the data to an information layer in real time based on the digital model and reliable perception, to realize intellisense and real-time interaction. By integrating geometry, physics, behavior, and rule models, the digital twin in this embodiment can collect fault data in real time, simulate an actual operation status of the specified submarine cable, perform high-fidelity description on the physical entity based on a plurality of dimensions and time scales, and establish a real-time mapping, to simulate, monitor, and diagnose a status and a behavior of the physical entity in a real environment. The digital twin is updated based on sensed data collected by the sensing device in real time. In this way, the digital twin is more approximate to the submarine cable entity.

The establishment of the digital twin of the specified submarine cable provides a data-driven way to comprehensively depict and describe device aging processes in different environments, human operation and maintenance behaviors and functions, and complex and uncertain evolution processes such as interaction with an environment. This is helpful to manage a whole life cycle of the submarine cable, effectively reduce operation costs of the submarine cable, improve a service life of the submarine cable.

With holographic digital mirroring and visualization capabilities provided by the digital twin, internal status information that is of complex links and cannot be obtained by using conventional means can be intuitively presented to operation and maintenance personnel by using technical means such as virtual reality and augmented reality. This provides an important means for a comprehensive energy system to rapidly discover, detect, and diagnose a fault. Field personnel can quickly locate a fault point and perform troubleshooting based on the information provided by the digital twin.

A multi-source data integration and utilization capability of the digital twin can be used to perform comprehensive research and determining based on a system operation history, a development trend, a device status, statistics of device faults of a same type, and other information, predict an operation life and a fault probability of an energy supply link, support more accurate predictive maintenance, and provide a flexible and efficient virtual test and evaluation environment for various operation and maintenance schemes.

Optionally, before the training the initial fault diagnosis model based on a differential evolution algorithm and a training sample to obtain the trained fault diagnosis model, the method further includes:

obtaining the training sample from the twin database, where the twin database includes deployment data, sensed data, and a fault type of a historical faulty submarine cable, and the training sample is generated based on the deployment data, the sensed data, and the fault type of the historical faulty submarine cable.

In this embodiment, the twin database stores information about manufacturing, principles, and components of the submarine cable entity, all data information and real-time data of the geometry, physics, behavior, and rule models of the digital twin, and simulation data of a virtual submarine cable. The training sample is obtained from the twin database to train the fault diagnosis model, so that the fault diagnosis model can get a more accurate diagnosis result.

Optionally, the obtaining deployment data and sensed data of a target submarine cable includes:

obtaining the deployment data and the sensed data of the target submarine cable from the twin database; or obtaining the deployment data of the target submarine cable from the engineering database and the sensed data of the target submarine cable from the sensing device.

Optionally, the sensing device includes at least one of the following: a ship monitoring device, an optical fiber perturbation monitoring device, a temperature detection device, and a strain monitoring device.

In this embodiment, the sensing device may exist in the following systems:

(1) Ship Monitoring System Integrating an Integrated Photoelectric and Radar System and an Automatic Identification System (AIS)

A maritime radar detection system is a solid-state active phase-controlled radar system. In a working process, the system can search offshore and low-altitude targets outside a range of visibility, discover a target entering the search range, trace the target, and establish a navigation track of the target. The system has a function of measuring a heading, a speed, and other motion attributes of the target. During working, a radar antenna periodically transmits an ultrahigh frequency (UHF) electromagnetic wave signal to a surrounding area, receives a reflected electromagnetic wave in real time, and determines a size, a distance, and other information of a blocked object based on a set of calculation models, to detect the object.

A radar signal is reflected when reaching the detected object. The reflected signal provides azimuth information. The azimuth information is converted into a digital value by an A/D conversion module, and the digital value undergoes polar coordinate transformation, image processing, and chart coordinate matching in turn to finally obtain an available radar chart by using a superposition technology.

(2) Submarine Cable Perturbation Monitoring System

When a ship passing through a sea area in which a submarine cable is located vibrates or a perturbation is caused to the ship due to anchoring, the submarine cable vibrates, causing deformation of an optical fiber. As a result, a length and a refractive index of the optical fiber are changed, and then a phase of the optical fiber is changed. After being processed by an optical system, the weak phase change is converted into a light intensity change. After photoelectric conversion and signal processing, the light intensity change enters a computer for data analysis. Based on an analysis result, the system determines whether the perturbation/vibration endangers safe operation of the submarine cable. When the perturbation/vibration exceeds a specified value, the system sends prewarning and alarm signals in time, and confirms a point at which the perturbation/vibration occurs, to provide real-time information for subsequent processing.

(3) Independent Temperature and Strain Monitoring System Based on a Distributed Temperature Sensing (DTS) System and a Brillouin Optical Time Domain Reflectometry (BOTDR)

The DTS system is introduced into the submarine cable monitoring system, and is combined with the BOTDR to independently monitor temperature and strain of the submarine cable. An optical fiber monitored by the DTS system and an optical fiber monitored by the BOTDR are located in a same optical unit of the submarine cable. Therefore, temperature of the two optical fibers can always be consistent. A temperature change of the optical fiber is measured by the DTS system, and a change of a Brillouin frequency shift of the optical fiber is measured by the BOTDR. Strain information of the optical fiber can be obtained through signal processing. Through integration of the DTS system and the BOTDR, the temperature and the strain are separated. In this way, the system can independently monitor the temperature and the strain of the submarine cable to improve strain monitoring accuracy of the submarine cable, monitor in real time anchor damages such as hooking and smashing caused by the ship to the submarine cable, discover the anchor damages caused by the ship, locate the anchor damages quickly and accurately, and monitor a current carrying capability of the submarine cable through temperature monitoring.

Correspondingly, the deployment data includes environmental information and/or cable routing information of the target submarine cable. The sensed data includes at least one of the following:

ship information, perturbation information, temperature information and strain information of an area in which the target submarine cable is located.

In this embodiment, the obtained data specifically includes the following data:

(1) Operation data of the submarine cable. A direct current resistance (DCR)-based dynamic cable current carrying technology is adopted to form a curve through conductor temperature modeling, optical fiber temperature measurement, integrated temperature analysis, and alarm value setting, to monitor a highest temperature point and an abnormal spike. A distributed optical fiber vibration sensing technology based on an optical time-domain reflectometer (OTDR) is used to study the law of action between the Brillouin frequency shift and intensity of the optical fiber and the strain and temperature change of the submarine cable, and obtain strain and temperature data of the submarine cable in a normal working state and a faulty state. The fault can be accurately determined based on the strain and temperature data of the optical fiber and the operation status of the submarine cable.

(2) Submarine terrain and water depth data. Construction of a three-dimensional submarine scene is a basis of three-dimensional visualization of engineering data of the submarine cable. In submarine landform measurement, a single-beam bathymeter and a multi-beam bathymeter are usually used to measure the water depth of the area in which the submarine cable is located, and obtain a precise underwater three-dimensional topographic map. In a shallow water area not covered by the multi-beam bathymeter, a digital dual frequency sounder can be used to collect the water depth data to form a high-precision underwater topographic map.

(3) Submarine landform data. The submarine landform data is usually collected by using a sidescan sonar technology, and the obtained data can be used as a basis for protection analysis of a rockfill dam, analysis of a cast iron casing pipe of the submarine cable, and analysis of other submarine features (such as fishing nets temporarily put by fishermen, such as shrimp cages, net ropes, and buoys).

(4) Submarine geological data. Propagation velocities of a sound wave are significantly different in different media, and densities of rock strata in different submarine interfaces are different. Therefore, reflection coefficients of the sound wave passing through different interfaces are also different. In this way, geological information of a submarine medium is carried in a received reflected signal. Through professional data processing, a final output data result can intuitively present a property of a bottom sediment.

(5) Hydrological data. Usually, to obtain a hydrological environment of the submarine cable, a water flow velocity in a routing area of the submarine cable is measured, and force applied to the submarine cable or its protection facility can be analyzed on this basis.

(6) Routing and crossover data of the submarine cable. The routing and crossover point data of the submarine cable are mainly generated by using a marine magnetometer to detect magnetic anomalies and accurately detect and locate pipes, cables and underwater obstacles. The generated data is usually in a MAG format. It is necessary to know a crossover position between a designed submarine cable and another submarine pipe (such as a submarine oil transmission pipe or a submarine optical cable communication line). This can prevent a damage to other existing submarine pipeline during construction of the submarine cable.

(7) Buried depth data of the submarine cable. A shallow (medium) stratum profiler is used. When there is a submarine cable on a seabed, because a material property of the submarine cable is significantly different from a property of a medium around the submarine cable, the shallow (medium) stratum profile passes vertically above the submarine cable during physical detection. After the submarine cable is identified by professional physical detection personnel, if buried depth information of the submarine cable needs to be obtained, it is necessary to find a vertex of a parabola, namely, a spatial position of the submarine cable. A difference between an elevation of the vertex of the parabola and a submarine elevation of the corresponding position is a buried depth of the submarine cable.

(8) Data indicating whether the submarine cable is exposed and suspended A method for detecting whether the submarine cable is exposed and suspended is consistent with that for detecting the buried depth of the submarine cable. In a result of detecting the buried depth of the submarine cable, when the obtained buried depth data is 0, it indicates that the submarine cable is exposed, and when the buried depth data of the submarine cable is a negative value, it indicates that the submarine cable is suspended. In addition, whether the submarine cable is completely exposed, partially exposed or in a critical state of exposure can be intuitively determined with the help of terrain and landform detection and a remote operated vehicle (ROV) camera.

In this embodiment, the above data can also be combined with the digital twin for position fusion to perform coordinate matching on all the engineering data of the submarine cable. Objects representing a same geographical entity are found from different source datasets, and extracted. Coordinates are added to the objects. Engineering information of each submarine cable is named by using a name of the submarine cable as a main ID. A name, a name of a supplying oil field, a voltage grade, manufacturer information, planning time, construction time, completion time, a management unit, an operation and maintenance team, a material, and other information of the submarine cable are displayed in a form of a property table.

Optionally, after the inputting the deployment data and the sensed data into a trained fault diagnosis model to obtain a diagnosis result of the target submarine cable, the method further includes:

storing the diagnosis result in the twin database; and/or
when the diagnosis result of the target submarine cable indicates that a fault occurs, sending an alarm message to a target terminal device to enable the target terminal device to display the alarm message, where the alarm message includes at least one of the following: an ID, the fault type, and a position message of the target submarine cable.

In this embodiment, the twin database can store a result of each fault diagnosis, and the diagnosis result may be used as the training sample of the fault diagnosis model, or may be used to monitor an operation status of the target submarine cable. Construction of a shore-based power supply project in an offshore oil field inevitably involves a large quantity of submarine cables. Because the submarine cables are deeply buried on the seabed, huge money and time need to be invested for maintenance after the submarine cables are faulty. Therefore, it is essential to monitor operation statuses and faults of the submarine cables. Safety of the submarine cable is mainly affected by the submarine cable itself, an anchor damage, temperature, and a natural factor. Therefore, it is necessary to introduce a safe and effective monitoring and protection measure to monitor a position, a path, a buried depth, and a damage degree of the submarine cable. This can effectively reduce maintenance costs.

An analysis result of an economic benefit of a submarine cable monitoring scheme for an offshore wind plant shows that the submarine cable monitoring system can effectively reduce the maintenance costs of the submarine cable, improve a current carrying capacity of the submarine cable, and increase generated energy, thereby increasing the economic benefit. The design of the comprehensive online submarine cable monitoring system is characteristic by safe, reliable and cost-effective operation. Wide application of shore-based power supply in the offshore oil field, data collection, comparison, and analysis, calculation method optimization, and application of the deep burying technology play an important role in improving integrity and reliability of the monitoring system and promoting development of the power industry.

It can be learned from the above that the present disclosure first obtains the deployment data and the sensed data of the target submarine cable, and then inputs the deployment data and the sensed data into the trained fault diagnosis model to obtain the diagnosis result of the target submarine cable, where the fault diagnosis model is the probabilistic neural network model, and the diagnosis result includes the fault type. The present disclosure uses the trained probabilistic neural network model as the fault diagnosis model to diagnose the fault of the target submarine cable, and can quickly and accurately obtain the fault type of the target submarine cable.

Figure 2:
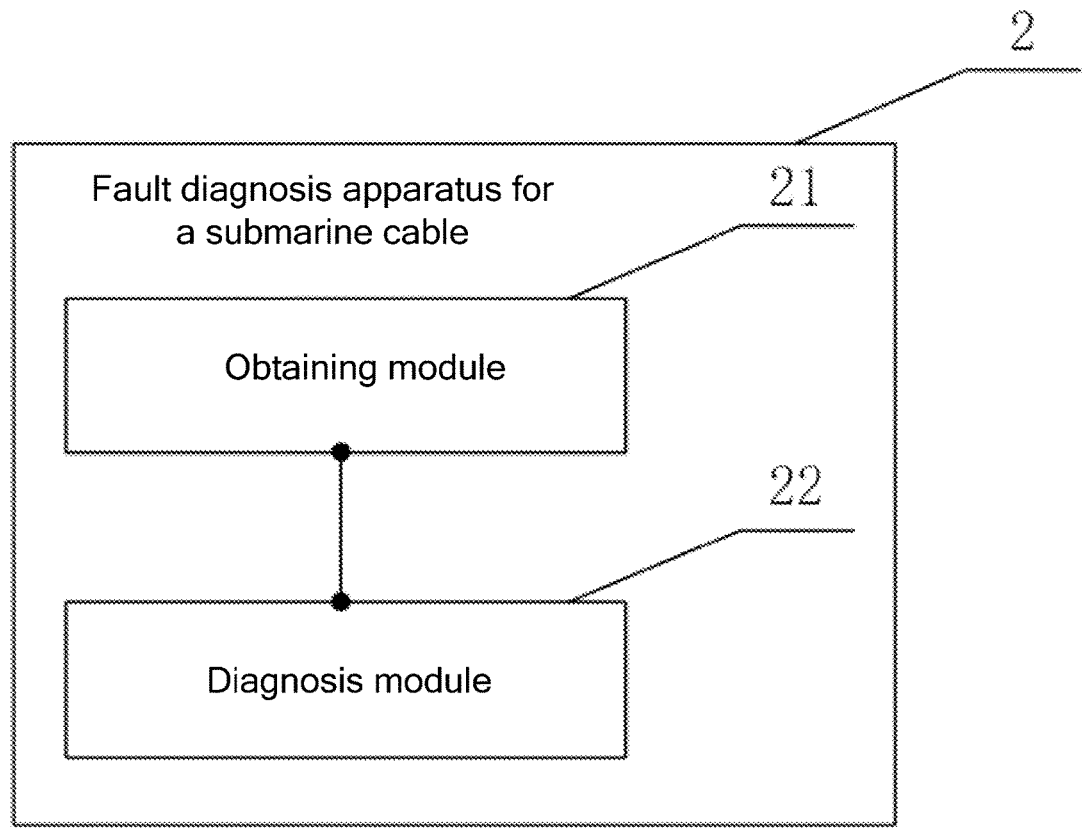
FIG. 2 is a schematic structural diagram of a fault diagnosis apparatus for a submarine cable according to an embodiment of the present disclosure.

FIG. 2 is a schematic structural diagram of a fault diagnosis apparatus for a submarine cable according to an embodiment of the present disclosure. For ease of illustration, only parts related to the embodiments of the present disclosure are shown, and are described in detail below.

As shown in FIG. 2, the fault diagnosis apparatus 2 for a submarine cable includes:
an obtaining module 21, configured to obtain deployment data and sensed data of a target submarine cable; and
a diagnosis module 22, configured to input the deployment data and the sensed data into a trained fault diagnosis model to obtain a diagnosis result of the target submarine cable, where the fault diagnosis model is a probabilistic neural network model, and the diagnosis result includes a fault type.

Optionally, the apparatus further includes:
a model establishment module, configured to establish an initial fault diagnosis model before the deployment data and the sensed data are input into the trained fault diagnosis model; and
a model training module, configured to train the initial fault diagnosis model based on a differential evolution algorithm and a training sample to obtain the trained fault diagnosis model.

Optionally, the model training module includes:
a smoothing parameter determining unit, configured to optimize a smoothing parameter in the initial fault diagnosis model based on the differential evolution algorithm to obtain a target smoothing parameter, where the smoothing parameter is a to-be-optimized item of the differential evolution algorithm, an objective function is a mean square deviation between a fault type obtained through fault diagnosis performed by the fault diagnosis model on the training sample and a real fault type of the training sample, and an optimal solution of the differential evolution algorithm minimizes the objective function; and
a sample training unit, configured to train, based on the training sample, a fault diagnosis model that uses the target smoothing parameter, to obtain the trained fault diagnosis model.

Optionally, the smoothing parameter determining unit is further configured to:
generate, in space of a preset dimension, individuals of a preset quantity that meet a preset constraint to obtain an initial population, where each individual is a candidate smoothing parameter;
use the initial population as a parent population, randomly select individuals of a specified quantity in the parent population as mutation objects, and perform an evolutionary operation on the parent population based on the mutation objects and the objective function to obtain a child population; and
if a total quantity of evolutionary operations is not less than a preset value, determine an optimal individual in the child population as the target smoothing parameter; otherwise, use the child population as a new parent population, and perform the step of "randomly selecting individuals of a specified quantity in the parent population as mutation objects, and performing an evolutionary operation on the parent population based on the mutation objects and objective function to a child population".

Optionally, the model training module further includes:
a sample obtaining unit, configured to obtain the training sample from a twin database before the initial fault diagnosis model is trained based on the differential evolution algorithm and the training sample to obtain the trained fault diagnosis model, where the twin database includes deployment data, sensed data, and a fault type of a historical faulty submarine cable, and the training sample is generated based on the deployment data, the sensed data, and the fault type of the historical faulty submarine cable.

Optionally, the obtaining module 21 is further configured to:
obtain deployment data of a specified submarine cable from an engineering database and sensed data of the specified submarine cable from a sensing device;
establish a digital twin of the specified submarine cable based on the deployment data and the sensed data of the specified submarine cable, where the digital twin includes the twin database; and
update the digital twin based on sensed data collected by the sensing device in real time.

Optionally, the obtaining module 21 is further configured to:
obtain the deployment data and the sensed data of the target submarine cable from the twin database; or
obtain the deployment data of the target submarine cable from the engineering database and the sensed data of the target submarine cable from the sensing device, where
the sensing device includes at least one of the following: a ship monitoring device, an optical fiber perturbation monitoring device, a temperature detection device, and a strain monitoring device; and
the deployment data includes environmental information and/or cable routing information of the target submarine cable, and the sensed data includes at least one of the following:

ship information, perturbation information, temperature information and strain information of an area in which the target submarine cable is located; and after the deployment data and the sensed data are input into the trained fault diagnosis model to obtain the diagnosis result of the target submarine cable, store the diagnosis result in the twin database; and/or when the diagnosis result of the target submarine cable indicates that a fault occurs, send an alarm message to a target terminal device to enable the target terminal device to display the alarm message, where the alarm message includes at least one of the following: an ID, the fault type, and a position message of the target submarine cable.

In this embodiment of the present disclosure, the obtaining module 21, the diagnosis module 22, the model establishment module, the model training module, the smoothing parameter determining unit, the sample training unit, and the sample obtaining unit each may be one or more processors or chips that each has a communication interface, can realize a communication protocol, and may further include a memory, a related interface and system transmission bus, and the like if necessary. The processor or chip executes program-related code to realize a corresponding function. Alternatively, the obtaining module 21, the diagnosis module 22, the model establishment module, the model training module, the smoothing parameter determining unit, the sample training unit, and the sample obtaining unit share an integrated chip or share devices such as a processor and a memory. The shared processor or chip executes program-related code to realize a corresponding function.

It can be learned from the above that the present disclosure first obtains the deployment data and the sensed data of the target submarine cable, and then inputs the deployment data and the sensed data into the trained fault diagnosis model to obtain the diagnosis result of the target submarine cable, where the fault diagnosis model is the probabilistic neural network model, and the diagnosis result includes the fault type. The present disclosure uses the trained probabilistic neural network model as the fault diagnosis model to diagnose the fault of the target submarine cable, and can quickly and accurately obtain the fault type of the target submarine cable.

Figure 3:
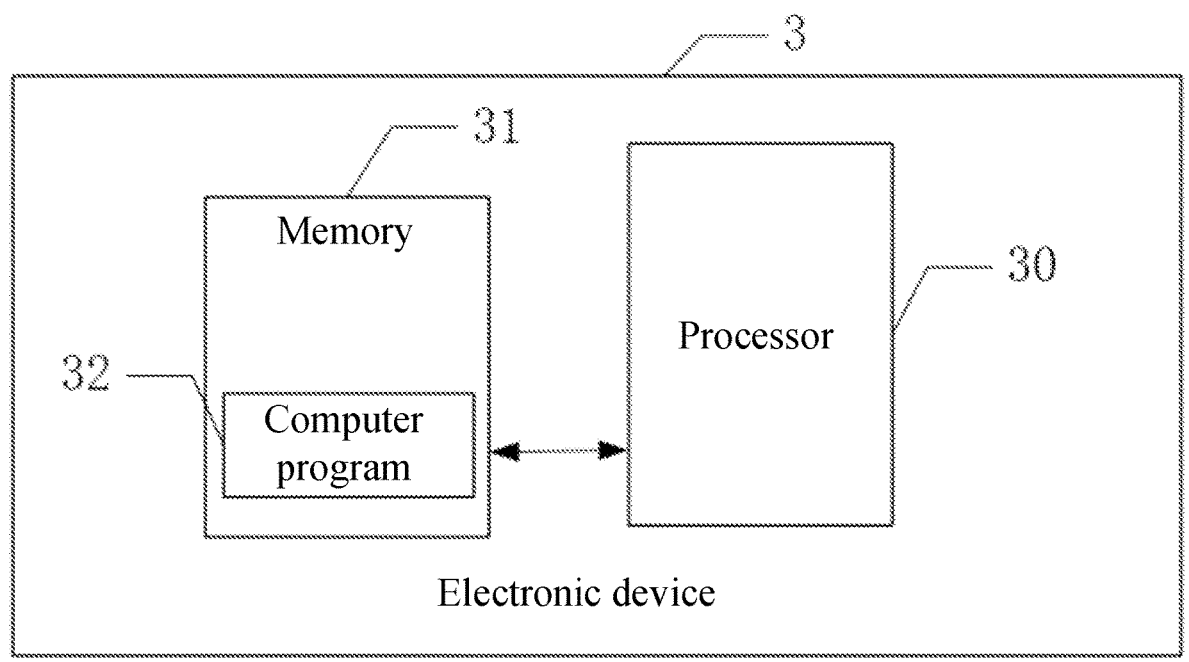
FIG. 3 is a schematic diagram of an electronic device according to an embodiment of the present disclosure.

FIG. 3 is a schematic diagram of an electronic device according to an embodiment of the present disclosure. As shown in FIG. 3, the electronic device 3 in this embodiment includes a processor 30, a memory 31, and a computer program 32 stored in the memory 31 and able to run on the processor 30. When executing the computer program 32, the processor 30 implements the steps in each above-mentioned embodiment of the fault diagnosis method for a submarine cable, for example, steps 101 and 102 shown in FIG. 1. Alternatively, when executing the computer program 32, the processor 30 implements the function of each module/unit in each above-mentioned apparatus embodiment, for example, functions of the modules 21 and 22 shown in FIG. 2.

For example, the computer program 32 may be divided into one or more modules/units. The one or more modules/units are stored in the memory 31 and executed by the processor 30 to complete the present disclosure. The one or more modules/units may be a series of computer program instruction segments capable of completing specific functions, and the instruction segments are used for describing an execution process of the computer program 32 in the electronic device 3.

The electronic device 3 may be a computing device such as a desktop computer, a notebook, a palmtop computer, or a cloud server. The electronic device may include, but not limited to, the processor 30 and the memory 31. Those skilled in the art can understand that FIG. 3 shows only an example of the electronic device 3, does not constitute a limitation to the electronic device 3, and may include more or less components than those shown in the figure, a combination of some components, or different components. For example, the electronic device may also include input and output devices, a network access device, a bus, and the like.

The processor 30 may be a central processing unit (CPU), or may be another general-purpose processor, a digital signal processor (DSP), an application specific integrated circuit (ASIC), a field-programmable gate array (FPGA) or another programmable logic device, a discrete gate or transistor logic device, a discrete hardware component, or the like. The general-purpose processor may be a microprocessor, or the processor may be any conventional processor or the like.

The memory 31 may be an internal storage unit of the electronic device 3, for example, a hard disk or an internal storage of the electronic device 3. The memory 31 may alternatively be an external storage device of the electronic device 3, such as a plug-in hard disk, a smart media card (SMC), a secure digital (SD) card, or a flash card that is equipped on the electronic device 3. Further, the memory 31 may alternatively include both an internal storage unit and an external storage device of the electronic device 3. The memory 31 is configured to store the computer program and other programs and data required by the electronic device. The memory 31 may further be configured to temporarily store data that has been output or will be output.

Those skilled in the art should clearly understand that, for convenient and concise description, only the division of the above-mentioned functional units/modules is used as an example for illustration. In practical application, the above-mentioned functions may be realized by different functional units/modules as required, that is, the internal structure of the apparatus is divided into different functional units or modules to complete all or part of the above-described functions. The functional units/modules in the embodiments may be integrated into one processing unit, or each of the units may exist alone physically, or two or more units are integrated into one unit. The above integrated unit may be implemented either in a form of hardware or in a form of a software functional unit. In addition, specific names of the functional units/modules are only for the convenience of distinguishing each other, and are not intended to limit the protection scope of the present disclosure. For specific working processes of the units/modules in the above system, reference may be made to the corresponding processes in the above method embodiment, and details are not described herein again.

In the above embodiments, the description of the embodiments each has a focus, and portions not described or recorded in detail in one embodiment may refer to the description of other embodiments.

Those of ordinary skill in the art may be aware that units and algorithm steps in examples described with reference to the embodiments disclosed in this specification can be implemented by electronic hardware or a combination of computer software and electronic hardware. Whether these functions are implemented by using hardware or software depends on specific applications and design constraints of the technical solutions. A person skilled in the art may use different methods to implement the described functions for each specific application, but such implementation should not be considered to be beyond the scope of the present disclosure.

It should be understood that the apparatus/terminal and method disclosed in the embodiments of the present disclosure may be implemented in other manners. For example, the apparatus/device embodiments described above are merely provided schematically. For example, the division of modules or units merely refers to logical function division, and there may be other division manners in actual implementation. For example, a plurality of units or components may be combined or integrated into another system, or some features may be ignored or not executed. In addition, the intercoupling or direct coupling or communication connection shown or discussed may be indirect coupling or communication connection through some interfaces, apparatuses, or units; or may be implemented in electrical, mechanical, or other forms.

The units described as separate parts may or may not be physically separate. Parts shown as units may or may not be physical units, which may be located in one position, or may be distributed on a plurality of network units. Some or all of the units may be selected according to actual needs to achieve the objectives of the solutions of the embodiments.

In addition, functional units in the embodiments of the present disclosure may be integrated into one processing unit, or each of the units may exist alone physically, or two or more units are integrated into one unit. The above integrated unit may be implemented either in a form of hardware or in a form of a software functional unit.

The integrated module/unit, if implemented in the form of a software functional unit and sold or used as a stand-alone product, may be stored in a computer-readable storage medium. Based on such an understanding, all or some of processes for implementing the method in the foregoing embodiments can be completed by a computer program instructing relevant hardware. The computer program may be stored in a computer-readable storage medium. When the computer program is executed by a processor, steps of the foregoing method embodiments can be implemented. The computer program includes computer program code, and the computer program code may be in a form of source code, object code, or an executable file, may be in some intermediate forms, or the like. The computer-readable medium may include: any physical entity or apparatus capable of carrying the computer program code, a recording medium, a USB disk, a mobile hard disk drive, a magnetic disk, an optical disc, a computer memory, a read-only memory (ROM), a random access memory (RAM), an electrical carrier signal, a telecommunications signal, a software distribution medium, and the like. It should be noted that, the content contained in the computer-readable medium may be added or deleted properly according to the legislation and the patent practice in the jurisdiction. For example, in some jurisdictions, depending on the legislation and the patent practice, the computer-readable storage medium may not include the electrical carrier signal or the telecommunications signal.

The foregoing embodiments are only used to explain the technical solutions of the present disclosure, and are not intended to limit the present disclosure. Although the present disclosure is described in detail with reference to the foregoing embodiments, persons of ordinary skill in the art should understand that they can still modify the technical solutions described in the foregoing embodiments, or make equivalent substitutions on some technical features therein. These modifications or substitutions do not make the essence of the corresponding technical solutions deviate from the spirit and scope of the technical solutions in the embodiments of the present disclosure, and shall fall within the protection scope of the present disclosure.

The invention claimed is:

1. A fault diagnosis method for a submarine cable, comprising:
    obtaining deployment data and sensed data of a target submarine cable; and
    inputting the deployment data and the sensed data into a trained fault diagnosis model to obtain a diagnosis result of the target submarine cable, wherein the fault diagnosis model is a probabilistic neural network model, and the diagnosis result comprises a fault type;
    wherein before the inputting the deployment data and the sensed data into a trained fault diagnosis model, the method further comprises:
    establishing an initial fault diagnosis model; and
    training the initial fault diagnosis model based on a differential evolution algorithm and a training sample to obtain the trained fault diagnosis model;
    wherein the training the initial fault diagnosis model based on a differential evolution algorithm and a training sample to obtain the trained fault diagnosis model comprises:
    optimizing a smoothing parameter in the initial fault diagnosis model based on the differential evolution algorithm to obtain a target smoothing parameter, wherein the smoothing parameter is a to-be-optimized item of the differential evolution algorithm, an objective function is a mean square deviation between a fault type obtained through fault diagnosis performed by the fault diagnosis model on the training sample and a real fault type of the training sample, and an optimal solution of the differential evolution algorithm minimizes the objective function; and
    training, based on the training sample, a fault diagnosis model that uses the target smoothing parameter, to obtain the trained fault diagnosis model.

2. The fault diagnosis method for a submarine cable according to claim 1, wherein the optimizing a smoothing parameter in the initial fault diagnosis model based on the differential evolution algorithm to obtain a target smoothing parameter comprises:
    generating, in space of a preset dimension, individuals of a preset quantity that meet a preset constraint to obtain an initial population, wherein each individual is a candidate smoothing parameter;
    using the initial population as a parent population, randomly selecting individuals of a specified quantity in the parent population as mutation objects, and performing an evolutionary operation on the parent population based on the mutation objects and the objective function to obtain a child population; and
    if a total quantity of evolutionary operations is not less than a preset value, determining an optimal individual in the child population as the target smoothing parameter; otherwise, using the child population as a new parent population, and performing the step of "randomly selecting individuals of a specified quantity in the parent population as mutation objects, and performing an evolutionary operation on the parent population based on the mutation objects and the objective function".

3. The fault diagnosis method for a submarine cable according to claim 1, wherein before the training the initial fault diagnosis model based on a differential evolution algorithm and a training sample to obtain the trained fault diagnosis model, the method further comprises:
obtaining the training sample from a twin database, wherein the twin database comprises deployment data, sensed data, and a fault type of a historical faulty submarine cable, and the training sample is generated based on the deployment data, the sensed data, and the fault type of the historical faulty submarine cable.

4. The fault diagnosis method for a submarine cable according to claim 3, wherein the method further comprises:
obtaining deployment data of a specified submarine cable from an engineering database and sensed data of the specified submarine cable from a sensing device;
establishing a digital twin of the specified submarine cable based on the deployment data and the sensed data of the specified submarine cable, wherein the digital twin comprises the twin database; and
updating the digital twin based on sensed data collected by the sensing device in real time.

5. The fault diagnosis method for a submarine cable according to claim 1, wherein the obtaining deployment data and sensed data of a target submarine cable comprises:
obtaining the deployment data and the sensed data of the target submarine cable from the twin database; or
obtaining the deployment data of the target submarine cable from the engineering database and the sensed data of the target submarine cable from the sensing device; wherein
the sensing device comprises at least one of the following: a ship monitoring device, an optical fiber perturbation monitoring device, a temperature detection device, and a strain monitoring device; and
the deployment data comprises environmental information and/or cable routing information of the target submarine cable, and the sensed data comprises at least one of the following:
ship information, perturbation information, temperature information and strain information of an area in which the target submarine cable is located; and
after the inputting the deployment data and the sensed data into a trained fault diagnosis model to obtain a diagnosis result of the target submarine cable, the method further comprises:
storing the diagnosis result in the twin database; and/or
when the diagnosis result of the target submarine cable indicates that a fault occurs, sending an alarm message to a target terminal device to enable the target terminal device to display the alarm message, wherein the alarm message comprises at least one of the following: an identifier (ID), the fault type, and a position message of the target submarine cable.

6. A fault diagnosis apparatus for a submarine cable, comprising:
an obtaining module, configured to obtain deployment data and sensed data of a target submarine cable; and
a diagnosis module, configured to input the deployment data and the sensed data into a trained fault diagnosis model to obtain a diagnosis result of the target submarine cable, wherein the fault diagnosis model is a probabilistic neural network model, and the diagnosis result comprises a fault type;
wherein the apparatus further comprises:
a model establishment module, configured to establish an initial fault diagnosis model before the deployment data and the sensed data are input into the trained fault diagnosis model; and
a model training module, configured to train the initial fault diagnosis model based on a differential evolution algorithm and a training sample to obtain the trained fault diagnosis model;
wherein the model training module comprises:
a smoothing parameter determining unit, configured to optimize a smoothing parameter in the initial fault diagnosis model based on the differential evolution algorithm to obtain a target smoothing parameter, where the smoothing parameter is a to-be-optimized item of the differential evolution algorithm, an objective function is a mean square deviation between a fault type obtained through fault diagnosis performed by the fault diagnosis model on the training sample and a real fault type of the training sample, and an optimal solution of the differential evolution algorithm minimizes the objective function; and
a sample training unit, configured to train, based on the training sample, a fault diagnosis model that uses the target smoothing parameter, to obtain the trained fault diagnosis model.

7. An electronic device, comprising a memory, a processor, and a computer program stored in the memory and able to run on the processor, wherein the processor performs steps of the fault diagnosis method for a submarine cable according to claim 1 when running the computer program.

8. A computer-readable storage medium, wherein the computer-readable storage medium stores a computer program, and the computer program, when executed by a processor, performs steps of the fault diagnosis method for a submarine cable according to claim 1.

* * * * *